United States Patent [19]

Long et al.

[11] 4,084,152

[45] Apr. 11, 1978

[54] TIME SHARED PROGRAMMABLE LOGIC ARRAY

[75] Inventors: Gerald Bernard Long, Shokan; Ralph Charles Mitchell; Shing Chou Pi, both of Kingston, all of N.Y.

[73] Assignee: International Business Machines Corporation, Armonk, N.Y.

[21] Appl. No.: 784,744

[22] Filed: Apr. 4, 1977

Related U.S. Application Data

[63] Continuation of Ser. No. 701,444, Jun. 30, 1976.

[51] Int. Cl.$^2$ .................. G11C 11/40; H03K 19/08
[52] U.S. Cl. .................. 340/166 R; 340/173 AM; 307/207; 364/716
[58] Field of Search .... 340/166 EL, 173 R, 173 AM, 340/166 R, 173 SP, 166 FE, 173 CA; 307/207, 235 R; 235/152

[56] References Cited

U.S. PATENT DOCUMENTS

| | | | |
|---|---|---|---|
| 3,895,360 | 7/1975 | Cricchi et al. | 340/173 R |
| 3,922,647 | 11/1975 | Broeker, Jr. | 340/173 R |
| 3,974,366 | 8/1976 | Hebenstreit | 235/152 |
| 3,975,623 | 8/1976 | Weinberger | 235/152 |
| 4,041,459 | 8/1977 | Horninger | 340/166 R |

Primary Examiner—Donald J. Yusko
Attorney, Agent, or Firm—Karl O. Hesse

[57] ABSTRACT

This specification describes arrays for performing logic functions. In these arrays input variables are placed on a series of parallel input lines that intersect a number of parallel output lines in a grid of intersections. Field effect devices at these intersections have their gate terminals connected to one of the input lines and their source terminal connected to one of the output lines and through a load device to a source of potential. The drain terminals of these devices are either unconnected, connected directly to ground or connected to ground through one of two switching devices. The devices with unconnected drains are inoperative. The devices with their drains connected directly to ground are operative at all times. While the devices connected to ground through one of the switches are operative only when the switch is closed. The array can be time shared by two different logic functions by having one or the other of the switches off at any given time.

5 Claims, 12 Drawing Figures

UNPERSONALIZATION

INHIBIT (NO VT SHIFT)

PERSONALIZATION

NORMAL MOS READ

TIME SHARED PROGRAMMABLE LOGIC ARRAY

This is a continuation, of application Ser. No. 701,444 filed June 30, 1976.

BACKGROUND OF THE INVENTION

The present invention relates to arrays for performing logic functions and more particularly it is related to increasing the number of logic functions performed in an array without increasing the size of the array.

The performing of logic in matrices of identical circuit elements each located at a unique intersection of an input and output line in a grid of intersecting input and output lines is well known. It is also well known that the standardization of logic circuit layouts stemming from the use of logic matrices or arrays results in the simplification and acceleration of the design and manufacture of monolithic chips containing logic performing circuits. However, up until now the use of the logic arrays has been limited. A major cause in this limited use has been that only a small percentage of the intersections in an array turn out to be usable in performing logic functions. This percentage of useful intersections in the arrays results in inefficient use of the surface area of the monolithic chips on which the arrays are fabricated. It turns out that, for most applications, the design and manufacturing efficiencies of logic arrays are outweighed economically by their inefficient use of chip area and it is less expensive to spend additional time and effort to design and manufacture logic chips with highly customized layouts that are less orderly than logic arrays but perform far more logic functions in a given area of a monolithic chip.

The small percentage of usable logic circuits in a logic array is a result of the orderliness of the array. Once input and output lines are used to perform a given logic function they cannot be used in performing other unrelated logic functions without hopelessly unbalancing the logic. As a result, large areas of the array contain intersections of input and output lines that are barren of usable circuits.

A number of schemes have been devised to reduce the sparseness of the logic on logic array chips. One such scheme is to use a plurality of decoders to feed input variables to the input lines of a single array allowing a number of very powerful logic functions to be efficiently performed in a single array. Another scheme used to reduce sparseness involves using compound arrangement of arrays called programmable array logic chips (PLA's). These involve feeding the output of a first array called a product term generator, or an AND array, to a second array called the sum of a product term generator, or an OR array, so as to increase the number of functions that can be performed without geometrically increasing the number of array intersections needed to perform those functions. While these modifications increase the number of useful logic circuits that can be placed in an array logic chip, they do not solve the problem of the unusable portions of the input and output lines that is discussed above.

It has been suggested in pending patent application Ser. No. 637,261 of Howley, Jones and Logue, "Reconfigurable Logic Array", filed Dec. 3, 1975 and assigned to the assignee of this invention and in pending patent application Ser. No. 534,944 of Muehldorf, "Time Split Array Logic Element And Method Of Operation", filed Dec. 20, 1974 and assigned to the assignee of this invention that the arrays be time shared by enabling and disabling the logic performing elements or gates in the arrays during different time periods. In particular, in patent application Ser. No. 534,944, the gates are each either enabled or disabled by data stored in one stage of a shift register. Each time a zero is stored in that stage the gate is not operable while each time a one is stored in that stage the gate is operable. By shifting the data in the shift registers different gates can be enabled during different time periods.

THE INVENTION

In accordance with the present invention, a new scheme for operating the gates is provided. In this scheme the gates are electrically connected and disconnected to control the period in which they function. This is done by having one terminal of the three terminal gates connected to one or more switching means for completing the excitation circuits to the gates thereby enabling the gates to be turned on or off during one or the other of two time periods. Gates that are used in all time periods can be permanently connected to excitation to maintain it operable during all time periods. In this way the circuits can be operated in a multiplexing mode at one time performing one logic function and at another time performing a different logic function.

Therefore, it is an object of the present invention to increase the amount of logic that can be performed by a logic array circuit chip of a given size.

Another object of the present invention is to reduce the size of segments of the array that cannot be used to perform usable logic functions.

A further object of the invention is to provide array logic that is more adaptable to the use of performing different logic functions.

THE DRAWINGS

These and other objects, features and advantages of the invention will be apparent from the following more particular description of the preferred embodiments of the invention of which:

Figure 5A:
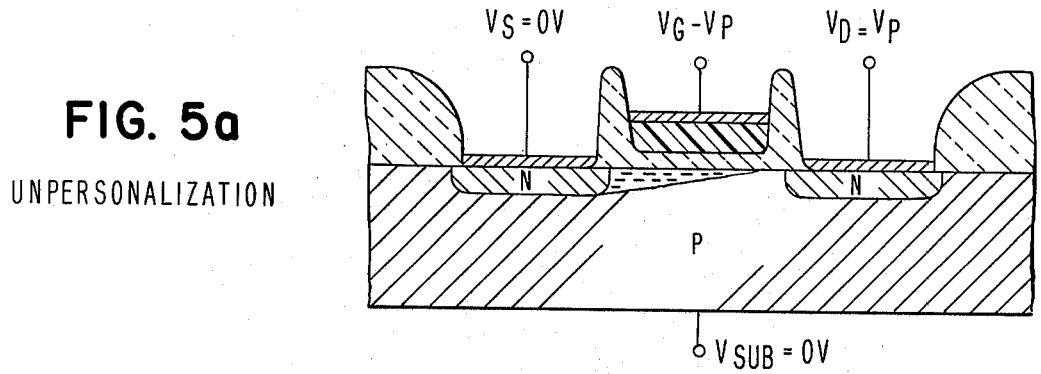

FIGS. 5A, B, C and D are of a MNOS device in four different modes of operation.

Figure 6:
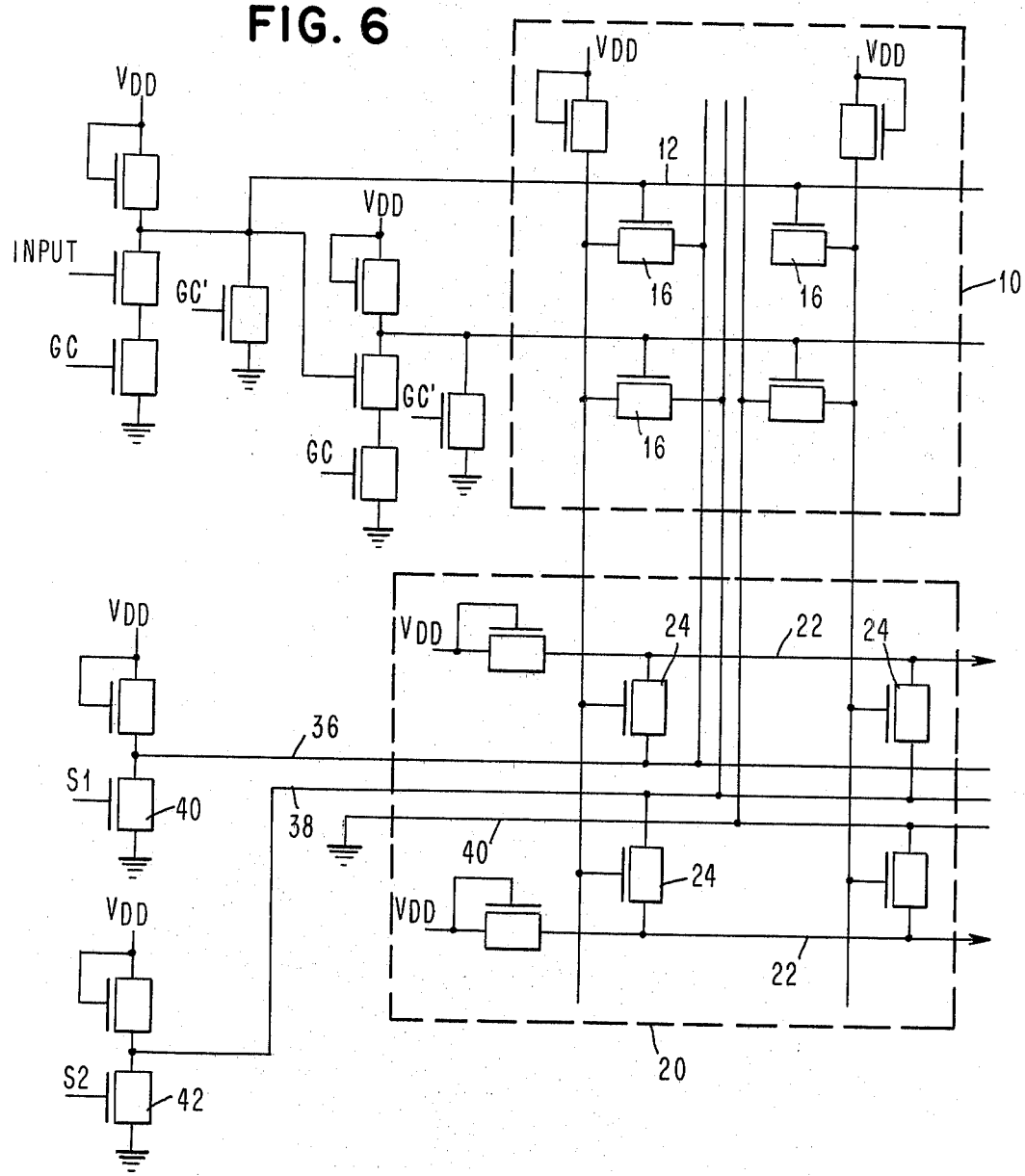

FIG. 6 is a schematic representation of a layout for a programmable logic array chip using the MNOS devices of FIGS. 5A, B, C and D to perform the present invention.

Figure 7:
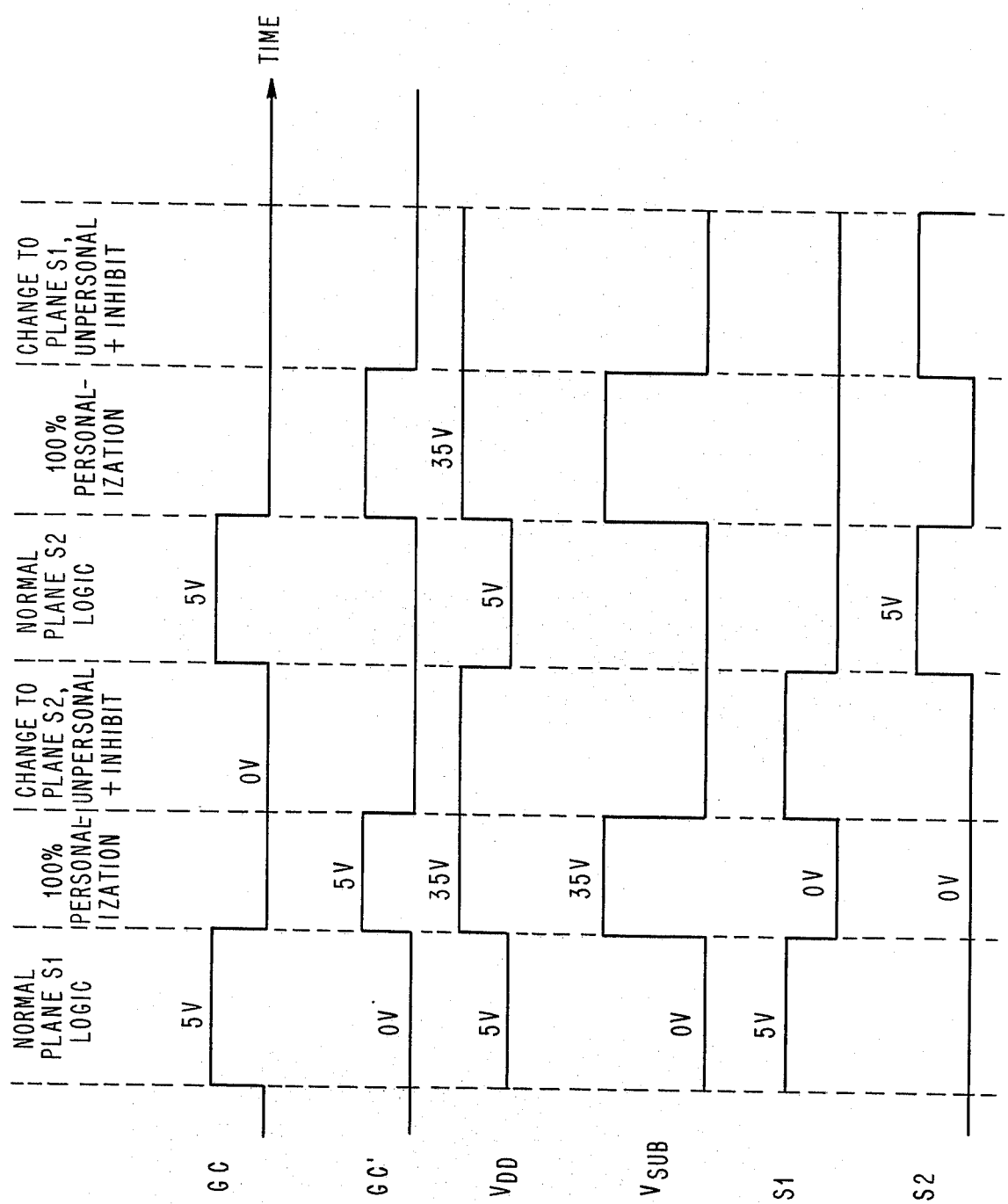

FIG. 7 is a timing diagram for operating the programmable logic array of FIG. 6.

DETAILED DESCRIPTION OF THE DRAWINGS

Figure 1:
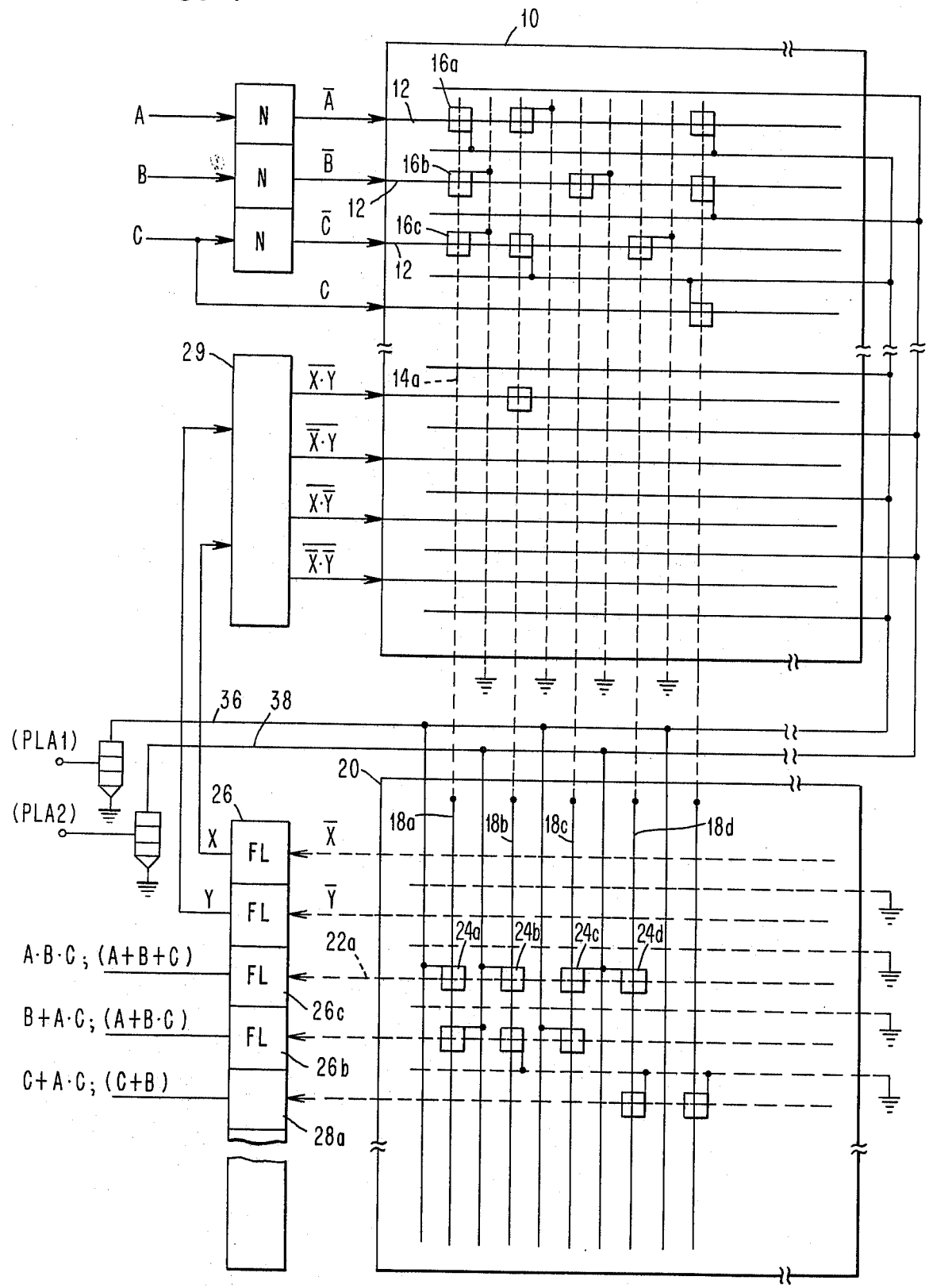
FIG. 1 is a schematic representation of a layout for a programmable logic array chip incorporating the present invention.

Referring now to FIG. 1, an AND array 10 receives positive input signals representing the true or complement of input variables A, B, C on a plurality of parallel input lines 12. Arranged orthogonally with respect to input lines are a plurality of parallel lines 14 that form a grid with the input lines. Located at the intersections of the input and output lines are logic performing devices 16 that will perform a logical operation, in this case a NOR or negative OR operation, on data placed on the input line 12 and will provide the resultant on the output lines 14. For instance, if any or all of the input lines 12a, 12b, or 12c are positive, the output line 14a will be held down by one or more of the devices 16a, 16b or 16c. Otherwise the line 14a will be at an up level.

The output lines 14 of the AND array 10 are connected to the input lines 18 of an OR array 20. These input lines 18 intersect the output lines 22 of the OR array. Located at these intersections are logic performing devices 24 which perform an OR function with respect to signals received from the AND array and provide the resultant on the output lines 22. For instance, if any or all of the input lines 18a, 18b, 18c or 18d are up, the output line 22a will be held down by one or more of the devices 24a, 24b, 24c or 24d. Otherwise, the line 24a will be at an up level.

The output lines supply set and reset inputs to a plurality of latches 26. The outputs of these latches such as the outputs of latches 26a, 26b or 26c can be fed off the programmable logic array chip or it can be fed back into the AND array possibly through a two bit decoder. Therefore the programmable logic array can perform combinatorial and sequential logic.

Figure 2:
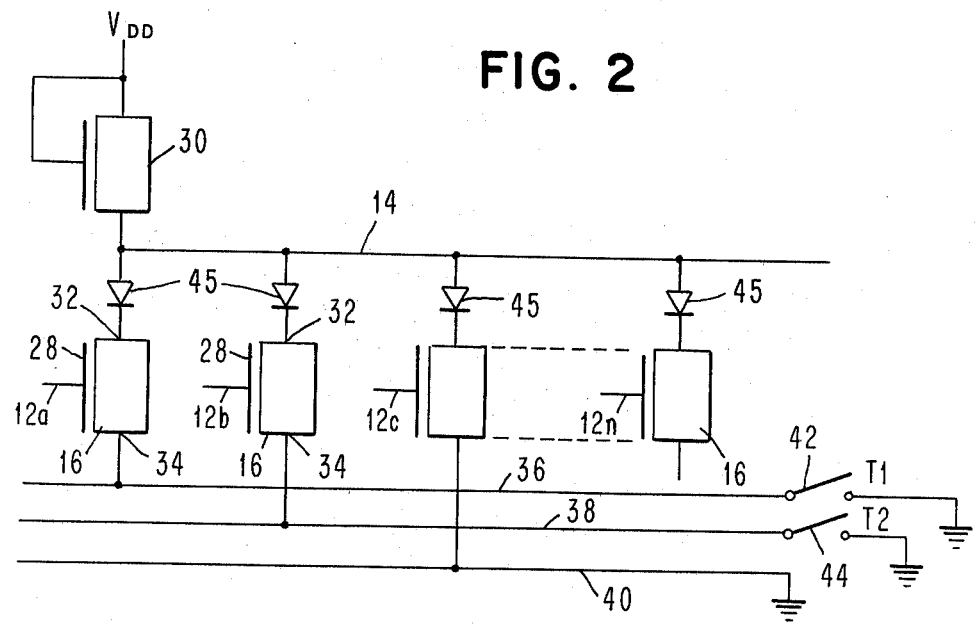
FIG. 2 is a more detailed representation of some of the gates in the arrays of FIG. 1.

Programmable logic arrays of this type are well known in the prior art. What is different in this application is the manner in which the devices 16 and 24 are connected to the excitation potentials so that two different sets of logic functions can be performed on the input variables at different times. Referring now to FIG. 2, it can be seen that the gates of the logic performing devices 16 are connected to the input lines 12a, while the drains of the logic performing devices 16 are connected to an output line 18a and through another field effect device 30 to a positive terminal of a source of potential. The sources 34 of the devices are either unconnected or connected to one of three lines 36, 38 and 40. One of the lines is a direct connection to ground and the other of the lines is a connection to ground through switches 42 and 44. The devices with sources that are not connected do not operate to perform logic functions in the array. The devices with sources connected to line 40 will be operable at all times while the devices connected through switches 42 and 44 will be operable only when the switches are closed. The switches are closed alternatively, that is, when switch 42 is closed, switch 44 is open and when switch 44 is closed, switch 42 is open so that there are two different operating time periods. One time period is when switch 42 is closed and one is when switch 44 is closed. When switch 42 is closed all of the devices with their sources connected to line 36 and all of the devices with their sources connected to line 40 are conducting. When switch 44 is closed all of the devices connected to line 38 and 40 are conducting. This permits two different logic functions to be performed at different times using the same arrays. In FIG. 2 diodes 45 are connected between the drains of the devices 16 and the lines. This is to prevent sneak paths which would permit a device 16 to conduct during a time period when it is supposed to be held inoperative by switch 42 or 44.

Referring back to FIG. 1, it can be seen that the lines 36, 38 and 40 are used to control the operation of both the AND and the OR arrays of the programmable logic arrays shown in that figure. Each of the arrays has its devices connected to one of the three lines. The logic functions performed by the array will now depend on two things. One is the arrangement of operable devices at the intersections of the two arrays. That is, which of the intersections has devices with their sources connected to one of the lines 36, 38 and 40. The other is which one of the three lines 36, 38 and 40 these operable devices have their sources connected to.

Figure 3:
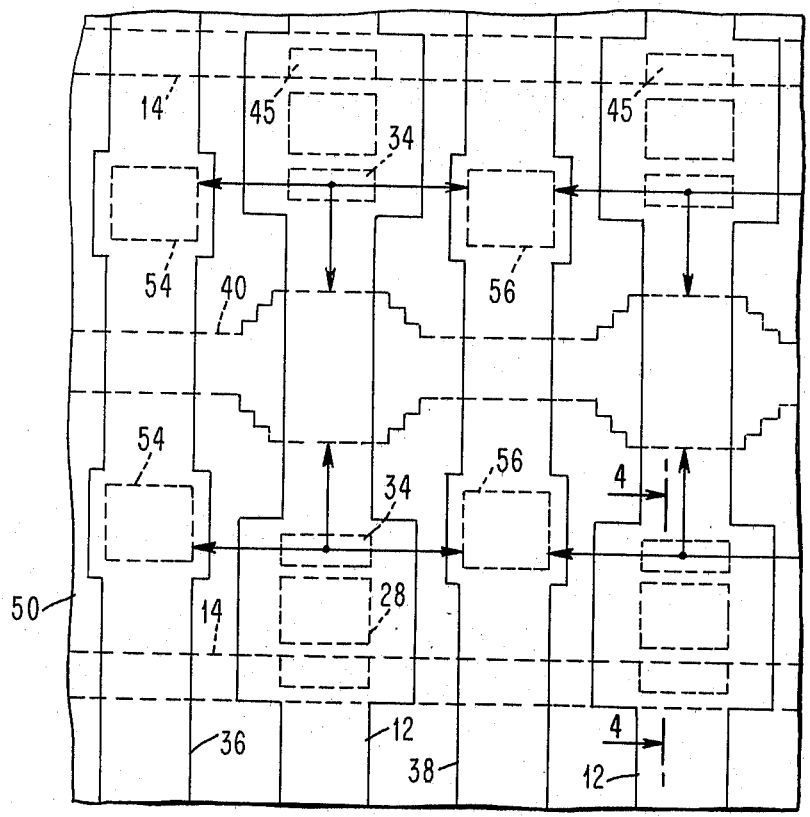
FIG. 3 is a layout for an array of FIG. 1.
Figure 4:
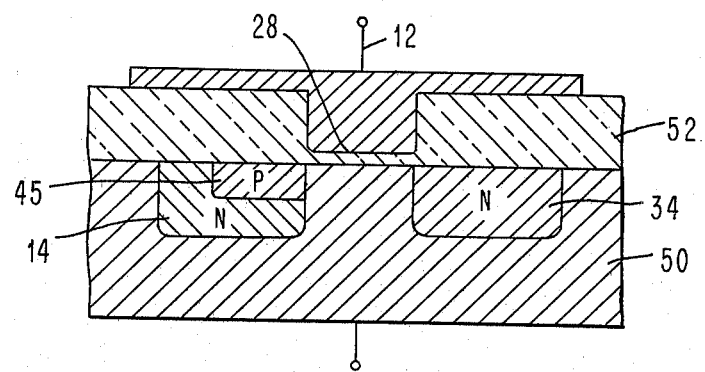
FIG. 4 is a section taken along line 4—4 in FIG. 1.

FIGS. 3 and 4 show how the device may be fabricated. The numbers here correspond to the numbers used for their functional equivalents in the AND array of the first two figures. The output lines 14 in that array are elongated diffusions 14 into the substrate 50 of the chip as are the lines 40 connected directly to the ground terminals. Overlying these diffusions on the personalization layer 52 of the chip are the metal lines 36 and 38 for connecting sources to the switches 42 and 44. In between each two lines 36 and 38 are the metal input lines 12. These connect in series the gates 28 of the devices 16. These gates are between the output line 14 for the device at a point where there is a diffusion in it to form the diode 45 and the diffusion which functions as the source 34 of the device. The source is selectively connected or not connected to the diffusion 40 or, through metalized via holes 54 and 56, to one of the metal lines 36 or 38 by a diffusion step performed at the same time as the lines 14 and 40 are diffused. If no diffusion is made to one of the lines 36, 38 and 40, at any given intersection there is not an active device at that intersection. If a connection is made to diffusion 40 the device will be active at all times. If a connection is made to line 36 the device will be active only when field effect device 42 is conducting and if the lines are connected to terminal 38 it will be operative only when field effect device 44 is conductive.

FIG. 5 shows a variable threshold or MNOS device which has all the characteristics of a MOS device plus the additional property of a changeable threshold voltage, $V_T$. The application of sufficient voltage pulses [$\sim \pm 35V$, 1–50$\mu$sec] across the nitride-oxide semiconductor causes the trapping of negative or positive charge at the nitride-oxide interface. Extra positive charge storage lowers the $V_T$ while negative charge storage at this interface raises the $V_T$.

In such a MNOS device it is possible to increase the $V_T$ sufficiently so that the device will not conduct when a normal gate voltage (5 volts) is applied. It is also possible to lower the $V_T$ of a device so that it is responsive to the normal gate voltage. This changing of MNOS device threshold may be done many ($\rightarrow \infty$) times.

The MNOS device can be used in four modes. The four terminal voltages, $V_G$, $V_D$, $V_S$, $V_{SUB}$ in different combinations determine which mode is being executed. FIG. 5 shows these four MNOS modes and the terminal voltage combinations which are required to execute these modes. In FIG. 5a, $V_G - V_s = V_p$, $V_D \geq V_G$ to isolate or pinch off the drain voltage from the channel. $V_{SUB}$ is a don't care voltage although it is shown as 0 volts, the normal read substrate voltage.

Figure 5B:
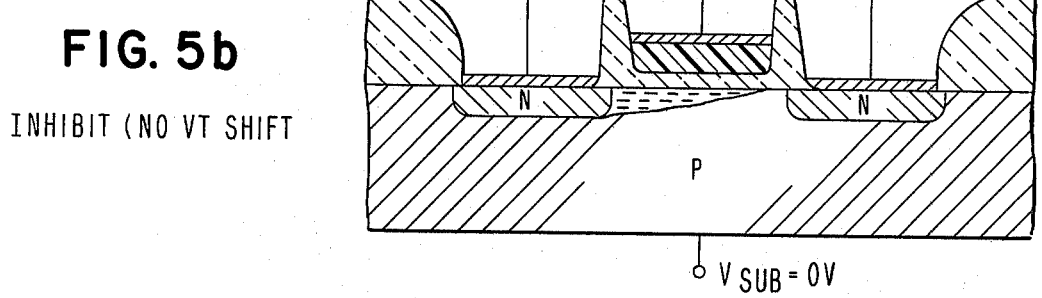

Similarly, the inhibit mode in FIG. 5b uses an inverted channel, and the channel voltage is determined by the source voltage to satisfy $$|V_G - V_{CH}| = |V_G - V_S| \leq V_C.$$

An important observation is that the unpersonalization and inhibit modes differ only in one terminal voltage → the source voltage. These two modes may be performed simultaneously on field effect devices which have separate source lines.

Figure 5C:
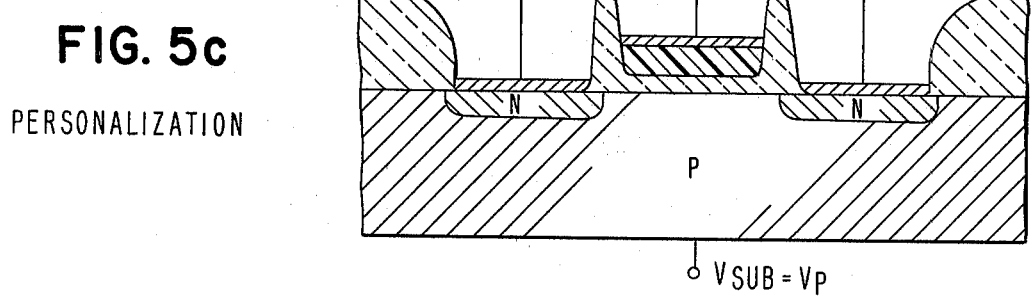

FIG. 5c shows the personalization mode which requires $V_{CH} - V_G = V_p$. Since $V_G = 0$ volts, the channel is accumulated and $V_{CH} = V_{SUB} = V_p$.

Figure 5D:
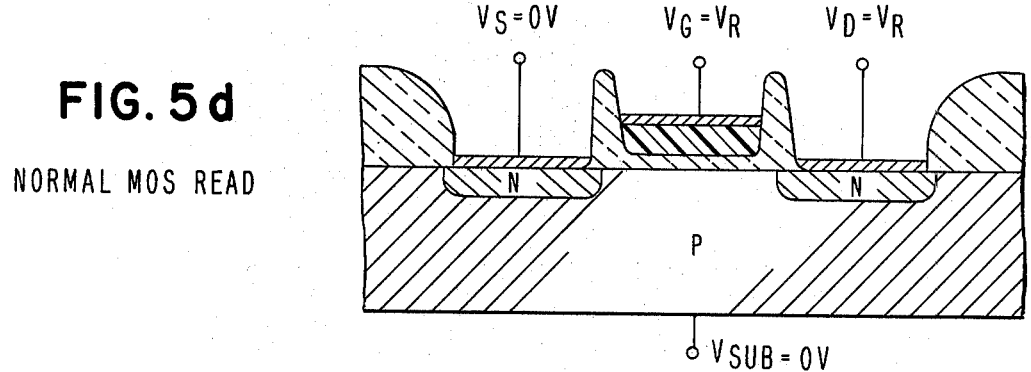

The normal read mode is shown in FIG. 5d where $V_R < V_C$.

Although actual voltage values depend on the device process, some typical voltage magnitudes are: $V_p = 35V$, $V_C = 18V$, $V_R = 5V$.

MNOS logic devices can be used as logic performing elements in programmable logic arrays to switch between programmable logic array logic planes by the following two step process:

1. Personalize all array bits,
2. Unpersonalize all bits in undesired planes while inhibiting the bits which belong to the desired planes.

FIGS. 6 and 7 give the details of how MNOS devices can be used to build multidimensional arrays. FIG. 6 gives the MNOS circuit implementation. The layout of the field effect devices with respect to the source lines 36, 38, and 40 of FIG. 3 still applies to this scheme. FIG. 7 shows six variables (two power supplies, $V_{SUB}$ and $V_{DD}$, and four control signals) which govern the operation of the circuit in FIG. 6.

Parasitic paths are not a problem with this MNOS approach because bits which are not involved with the logic plane being executed have been rendered nonconductive. Since these unused bits do not conduct, the parasitic path is broken.

While the invention has been particularly shown and described with reference to a preferred embodiment thereof, it will be understood by those skilled in the art that the above and other changes in form and details may be made therein without departing from the spirit and scope of the invention.

What is claimed is:

1. In a logic performing arrangement including an array having a plurality of input lines intersected by a plurality of output lines with elements located in the form of a gated three terminal device at at least some of the intersections of the input and output lines with one of the terminals coupled to the input line and the other connected to the output line at that intersection so that logical functions are performed on interrogation signals placed on the input lines and the responses thereto placed on the output lines, the improvements comprising;

a first group of said logic elements for performing a first logic function on input signals placed on the input lines of said array, a second logic group performing a second conflicting function on input signals placed on the input lines of the array, different switch means coupling each of said groups to source of excitation potential when the switch means is operative and uncoupling said group of devices from the source of excitation when the switch means is nonoperative so that logic performed in those two groups will depend on whether the said switch means is operative or nonoperative and, means for rendering said switch operative at different times whereby there is no conflict in the logic functions performed in the logic performing arrangement.

2. The logic arrangement of claim 1 including a third group of said logic elements which are coupled to a source of excitation potential for operation with both the first and second groups.

3. The logic arrangement of claim 1 wherein said gated three terminal devices are field effect transistors each with a diode coupled to its source.

4. The logic arrangement of claim 3 wherein the gate of each said field effect transistor is connected to an input line of the array, the source and drains of said field effect transistor are connected in series with said source of excitation potential, the diode coupled to the field effect transistor, and one of the different switch means.

5. The logic arrangement of claim 1 wherein said gated three-terminal devices are MNOS devices to prevent conduction during the time the devices are decoupled from the source of excitation potential.

* * * * *